United States Patent
Nishida et al.

(10) Patent No.: US 11,255,907 B2
(45) Date of Patent: Feb. 22, 2022

(54) SEMICONDUCTOR DEVICE AND METHOD OF CONTROLLING SELF-DIAGNOSIS

(71) Applicant: RENESAS ELECTRONICS CORPORATION, Tokyo (JP)

(72) Inventors: Yoshinori Nishida, Tokyo (JP); Yoichi Maeda, Tokyo (JP); Jun Matsushima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/534,560

(22) Filed: Aug. 7, 2019

(65) Prior Publication Data
US 2020/0072903 A1 Mar. 5, 2020

(30) Foreign Application Priority Data
Aug. 28, 2018 (JP) .............................. JP2018-158893

(51) Int. Cl.
*G01R 31/3185* (2006.01)
*G01R 31/3187* (2006.01)
*G01R 31/3183* (2006.01)
*G01R 31/3181* (2006.01)

(52) U.S. Cl.
CPC . *G01R 31/318555* (2013.01); *G01R 31/3187* (2013.01); *G01R 31/31813* (2013.01); *G01R 31/318335* (2013.01)

(58) Field of Classification Search
None
See application file for complete search history.

(56) References Cited

U.S. PATENT DOCUMENTS

| 4,588,945 | A | * | 5/1986 | Groves | ............ | G01R 31/31915 324/73.1 |
| 5,260,649 | A | * | 11/1993 | Parker | ............ | G01R 31/318586 714/727 |
| 7,103,495 | B2 | * | 9/2006 | Kiryu | ................. | G01R 31/2855 702/117 |
| 2005/0210352 | A1 | * | 9/2005 | Ricchetti | ........ | G01R 31/318555 714/733 |
| 2005/0242980 | A1 | * | 11/2005 | Collins | .......... | G01R 31/318555 341/155 |

(Continued)

FOREIGN PATENT DOCUMENTS

WO 2016/084165 A1 6/2016

*Primary Examiner* — April Y Blair
*Assistant Examiner* — Matthew W Wahlin
(74) *Attorney, Agent, or Firm* — McDermott Will & Emery LLP

(57) ABSTRACT

A semiconductor device capable of suppressing a sharp change in current consumption and a self-diagnosis control method thereof are provided. According to one embodiment, the semiconductor device 1 includes a logic circuit, which is a circuit to be diagnosed, a self-diagnostic circuit for diagnosing the logic circuit, and a diagnostic control circuit for controlling the diagnosis of the logic circuit by the self-diagnostic circuit, and the diagnostic control circuit includes a diagnostic abort control circuit for gradually stopping the diagnosis of the logic circuit by the self-diagnostic circuit when the semiconductor device receives a stop signal instructing the stop of the diagnosis of the logic circuit by the self-diagnostic circuit.

12 Claims, 14 Drawing Sheets

(56) References Cited

U.S. PATENT DOCUMENTS

| | | | |
|---|---|---|---|
| 2014/0132291 A1* | 5/2014 | Somachudan | G01R 31/31724 324/750.3 |
| 2014/0310666 A1* | 10/2014 | Chung | G06F 30/398 716/102 |
| 2016/0025808 A1* | 1/2016 | Singh | G01R 31/3177 714/733 |
| 2016/0275008 A1* | 9/2016 | Mclaughlin | G06F 11/2284 |
| 2017/0285106 A1 | 10/2017 | Maeda et al. | |

\* cited by examiner

FIG. 8

```
001 : Clock-on processing
002 : Test setting process
003 :   Test execution process
004 :   Test cool-down process
005 : Test result determination processing
006 : jump to 021
010 : Discontinuation processing jump point1
011 : Test cool-down process
012 : jump to 021
020 : Discontinuation processing jump point2
021 : Clock-off process
```

FIG. 14

001 : Clock-on process
002 : Test setting process
003 : Test execution process
004 : Diagnostic abort signal
005 : Test result determination process
006 : Clock-off process

SEMICONDUCTOR DEVICE AND METHOD OF CONTROLLING SELF-DIAGNOSIS

CROSS-REFERENCE TO RELATED APPLICATIONS

The disclosure of Japanese Patent Application No. 2018-158893 filed on Aug. 28, 2018 including the specification, drawings and abstract is incorporated herein by reference in its entirety.

BACKGROUND

The present invention relates to a semiconductor device and a self-diagnosis control method thereof, and, for example, to a semiconductor device suitable for suppressing a sharp change in current consumption and a self-diagnosis control method thereof.

For example, in order to satisfy the functional safety standard for automobiles, the semiconductor device mounted on the automobile is provided with a self-diagnostic function (IST; In-System-Test). The self-diagnosis is performed when the power source is started (when the power is turned on) or periodically during normal operation by using, for example, BIST (Built In Self Test) circuits.

Here, the semiconductor device is required not only to suppress the power consumption at the time of self-diagnosis to be equal to or less than the power consumption permitted at the time of normal operation, but also to suppress the rate of change (di/dt) of the current consumption at the time of self-diagnosis to be equal to or less than the rate of change of the current consumption permitted at the time of normal operation. Therefore, in periodic self-diagnosis during normal operation, for example, diagnosis of a plurality of circuits to be diagnosed is performed at different timings. As a result, power consumption at the time of self-diagnosis is suppressed, and a sharp change in current consumption at the time of self-diagnosis is suppressed. However, when the operation mode is switched from the self-diagnosis mode to the normal operation mode (user mode) after the test operation of the circuit to be diagnosed, there is a possibility that the current consumption changes abruptly.

A solution to such a problem is disclosed in International Patent Application Publication No. WO 2016/084165. The semiconductor device disclosed in International Patent Application Publication No. WO 2016/084165 suppresses a sharp change in current consumption after a test operation by stopping generation of test patterns by a plurality of pattern generation circuits at different timings after a test operation of a circuit to be diagnosed.

SUMMARY

However, International Patent Application Publication No. WO 2016/084165 discloses that, after the test operation of the circuit to be diagnosed, the production of the test pattern by the plurality of pattern generating circuits is stopped at different times. However, it does not disclose or suggest the operation when a signal (e.g., a reset signal from an external source) indicating the discontinuation of the Diagnostic process is received during the execution of the Diagnostic process.

Accordingly, it is considered that JP-A No. 1 immediately stops the operation of the Self-diagnostic circuit including a plurality of pattern generating circuits when it receives a signal indicating the discontinuation of the Diagnostic process during the execution of the Diagnostic process. Accordingly, in the configuration of International Patent Application Publication No. WO 2016/084165, there was a problem that the current consumed would change abruptly when the Diagnostic process being executed is discontinued. As a result, for example, the fluctuation of the power supply voltage becomes large, so that the operation of the semiconductor device becomes unstable. Other objects and novel features will become apparent from the description of this specification and the accompanying drawings.

Means of Solving the Problems

According to one embodiment, the semiconductor device comprises a circuit to be diagnosed, a Self-diagnostic circuit for diagnosing the circuit to be diagnosed, and a Diagnostic control circuit for controlling the diagnosis of the circuit to be diagnosed by the Self-diagnostic circuit, and the Diagnostic control circuit has a Diagnostic abort control circuit for stopping the diagnosis of the circuit to be diagnosed by the Self-diagnostic circuit in a stepwise manner when the semiconductor device receives a stop signal instructing the stop of the diagnosis of the circuit to be diagnosed by the Self-diagnostic circuit.

According to another embodiment, a self-diagnosis control method of a semiconductor device performs diagnosis of a circuit to be diagnosed by a Self-diagnostic circuit, and when a stop signal instructing stop of diagnosis of the circuit to be diagnosed by the Self-diagnostic circuit is received, the self-diagnosis control method stops the diagnosis of the circuit to be diagnosed by the Self-diagnostic circuit step by step.

According to the above-mentioned embodiment, it is possible to provide a semiconductor device capable of suppressing a sharp change in current consumption and a self-diagnosis control method thereof.

BRIEF DESCRIPTION OF THE DRAWINGS

FIG. 8 is a diagram illustrating an example of a program stored in a memory of a semiconductor device;

FIG. 14 is a diagram illustrating an example of a program stored in a memory of a semiconductor device according to a comparison example;

DETAILED DESCRIPTION

Figure 1:
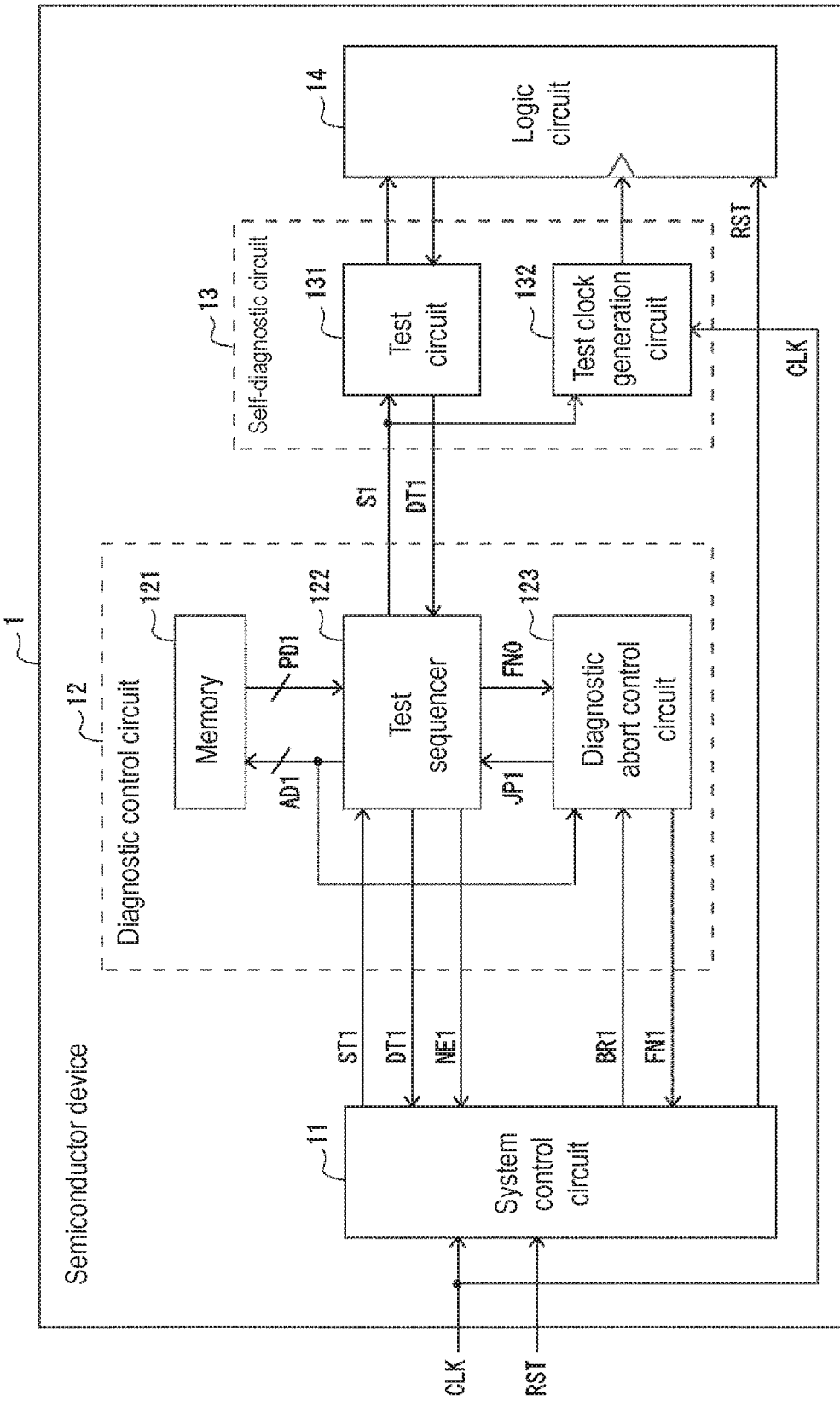
FIG. 1 is a block diagram illustrating a configuration example of a semiconductor device according to a first embodiment.

For clarity of explanation, the following description and drawings are appropriately omitted and simplified. In addition, the respective elements described in the drawings as functional blocks for performing various processes can be configured by a CPU (Central Processing Unit), a memory, and other circuits in terms of hardware, and are realized by programs loaded in the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

FIG. 1 is a block diagram showing a configuration example of a semiconductor device 1 according to a first embodiment. The semiconductor device 1 according to the present embodiment has a self-diagnostic function for performing a diagnosis of Logic circuit, which is a circuit to be diagnosed, and when a stop signal is received indicating that the Diagnostic process is stopped during the execution of the Diagnostic process, the Diagnostic process is stopped in a step-by-step manner. Accordingly, the semiconductor device 1 according to the present embodiment can suppress a steep change in the current consumed even when the Diagnostic process is stopped during execution. As a result, the fluctuation of the power supply voltage is suppressed, so that the operation of the semiconductor device 1 is stabilized. Hereinafter, a concrete description will be given.

As shown in FIG. 1, the semiconductor device 1 includes a system control circuit 11, a Diagnostic control circuit 12, a Self-diagnostic circuit 13, and a Logic circuit 14 which is a circuit to be diagnosed.

The system control circuitry 11 outputs to the Diagnostic control circuit 12 a diagnostic start signal ST1 indicating the start of the diagnosis of the Logic circuit 14, or compares the test result DT1 of the Logic circuit 14 with the expected value to determine the presence or absence of a failure of the Logic circuit 14. When the system control circuit 11 receives a reset signal RST from a host system (not shown) provided outside the semiconductor device 1, for example, the system control circuit suspends the output of the reset signal RST to the Logic circuit 14, and outputs the Diagnosis abort signal BR 1 instructing the Diagnostic control circuit 12 to Diagnosis abort the Logic circuit 14. After the Diagnostic process is stopped, the reset signal RST is outputted to the Logic circuit 14. The Logic circuit 14 is thereby initialized.

The Diagnostic control circuit 12 is a so-called IST-control circuit, and controls diagnostics of the Logic circuit 14 by the Self-diagnostic circuit 13 when the power supply is started and periodically during normal operation. The Self-diagnostic circuit 13 is controlled by the Diagnostic control circuit 12, and performs diagnosis of the Logic circuit 14, which is a circuit to be diagnosed.

Specifically, the Diagnostic control circuit 12 includes a memory 121, a test sequencer 122, and a Diagnostic abort control circuit 123. The Self-diagnostic circuit 13 includes a test circuit 131 and a Test clock generation circuit 132. The test circuit 131 is a so-called BIST circuit.

When receiving the diagnostic start signal ST1 from the system control circuit 11, the test sequencer 122 sequentially acquires the programs stored in the memory 121 and sequentially executes the Diagnostic process according to the acquired programs in the Self-diagnostic circuit 13. For example, the test sequencer 122 causes the Self-diagnostic circuit 13 to sequentially execute the Clock-on process, the Test setting process, the Test execution process, the Test cool-down process, the Test result determination process, and the Clock-off process by outputting control signals S 1 corresponding to the acquired programs to the Self-diagnostic circuit 13. Details of each process will be described later.

Upon receiving the Diagnosis abort signal BR1 from the system control circuit 11, the Diagnostic abort control circuit 123 determines the content of the currently executed process from the address information AD1 included in the access signal from the test sequencer 122 to the memory 121. After that, the Diagnostic abort control circuit 123 stops the diagnosing of the Logic circuit 14 by the Self-diagnostic circuit 13 in stages by using the process content of the Diagnosis abort according to the determination result.

More specifically, the Diagnostic abort control circuit 123 outputs a jump-signal JP1 to the test sequencer 122 so as to switch accesses to the storage areas of the memories 121 in which the programs of the Diagnosis abort process content corresponding to the content of the process currently being executed are stored. As a result, the test sequencer 122 acquires the program of the address switched by the jump signal JP1 from the memory 121, and causes the Self-diagnostic circuit 13 to execute the Diagnosis abort process corresponding to the acquired program.

Thereafter, when the Diagnostic process of the Logic circuit by the Self-diagnostic circuit 13 is stopped, the test sequencer 122 outputs a Diagnosis abort completion signal FN0 indicating that the Diagnostic process is stopped to the Diagnostic abort control circuit 123. Upon receiving the Diagnosis abort completion signal FN0 from the test sequencer 122, the Diagnostic abort control circuit 123 outputs a Diagnosis abort completion signal FN1 to the system control circuit 11. The operation of the Diagnostic abort control circuit 123 will be described in detail later.

Figure 2:
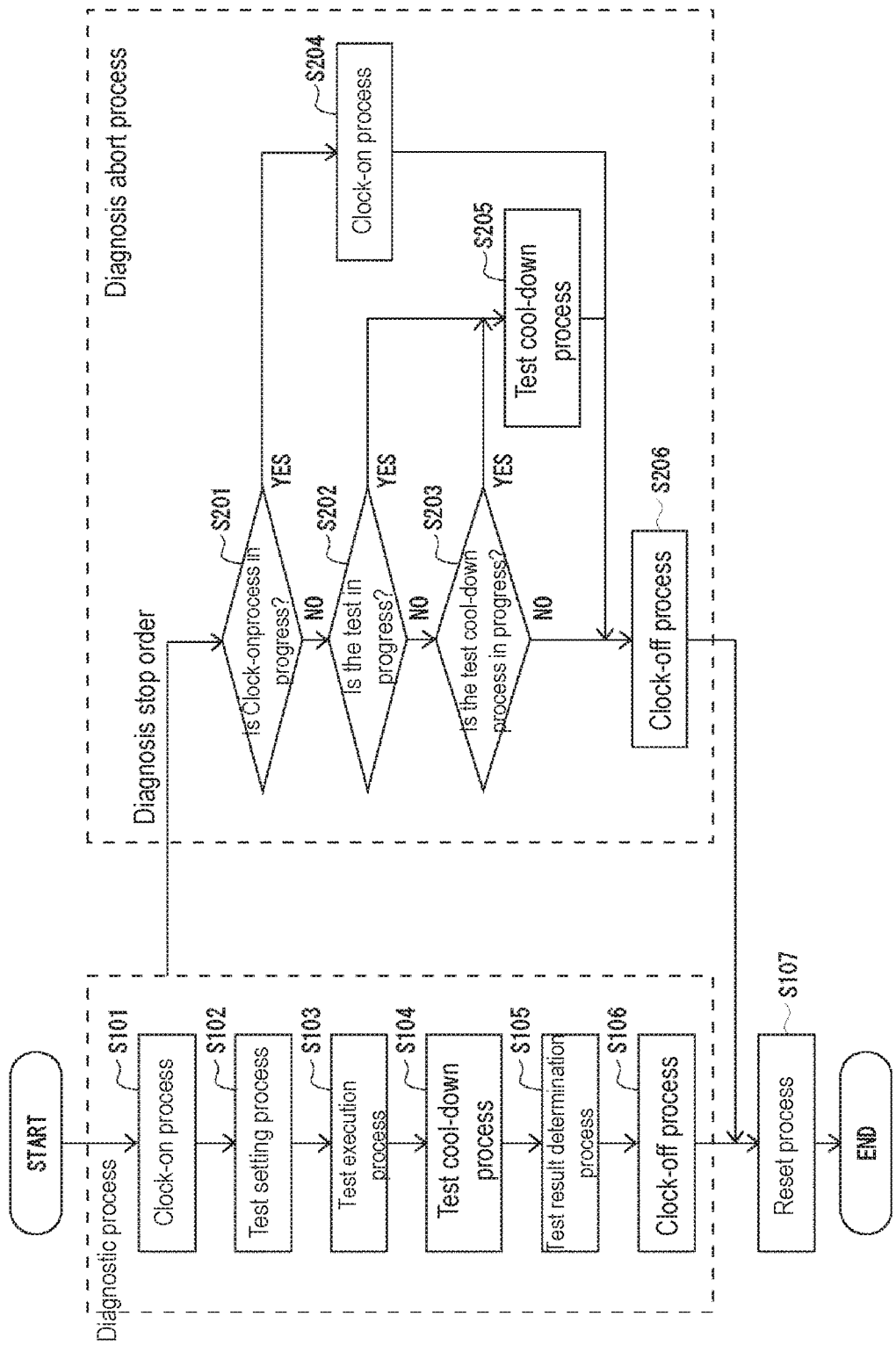
FIG. 2 is a flow chart illustrating the operation of the self-diagnosis of a semiconductor device.

Next, the self-diagnosis operation of the semiconductor device 1 will be described. FIG. 2 is a flowchart showing the operation of self-diagnosis of the semiconductor device 1.

First, the operation of self-diagnosis in the normal state of the semiconductor device 1 will be described with reference to FIG. 2.

When the diagnostic start signal ST1 is outputted from the system control circuit 11, the Diagnostic control circuit 12 starts the control of the Diagnostic process of the Logic circuit 14 by the Self-diagnostic circuit 13.

In Diagnostic process, the Clock-on process (step S101), the Test setting process (step S102), the Test execution process (step S103), the Test cool-down process (step S104), the Test result determination process (step S105), and the Clock-off process (step S106) are executed in order.

In Clock-on process, the test clock signal TCK is set to start supplying the test clock signal TCK to the Logic circuit 14, which is a circuit to be diagnosed. Specifically, the Test clock generation circuit 132 starts outputting the clock signal CLK to the Logic circuit 14 as the test clock signal TCK based on the control signal S 1 from the test sequencer 122.

In Test setting process, the test circuit 131 is initialized. The Test setting process is performed after the setting of the test clock signal TCK to the Logic circuit 14 is completed and before the test operation of the Logic circuit 14 by the Self-diagnostic circuit 13 is started.

In Test execution process, the testing operation of the Logic circuit 14 is executed by the Self-diagnostic circuit 13. For example, the test circuit 131 provided in the Self-diagnostic circuit 13 includes a test pattern generating circuit for generating a test pattern and a test result compressing circuit for compressing a test result. The test pattern generator supplies a test pattern to a scan chain configured in the Logic circuit 14. Thereafter, the flip-flops provided in the Logic circuit 14 output test results corresponding to the test patterns. Thereafter, the test results of the respective flip-flops are inputted to the test result compressing circuits through the scan chain as the test results of the Logic circuit 14. The test result compression circuit compresses the test result input via the scan chain.

In the Test cool-down process, after the Test execution process, the power consumed is gradually reduced by the testing operation of the Logic circuit 14 by the Self-diagnostic circuit 13. Specifically, the Diagnostic control circuit 12 gradually reduces the frequency of the test clock signal TCK generated by the Test clock generation circuit 132 to a predetermined frequency while causing the test circuit 131 to generate a test pattern. As a result, the power consumption is gradually reduced in a state in which the rate of change of the current consumption is suppressed within the allowable range.

In the Test result determination process, the test result DT1 of the Logic circuit 14 is transmitted from the test circuit 131 to the system control circuit 11 via the test sequencer 122. The system control circuit 11 compares, for example, the test result DT1 of the Logic circuit 14 with an expected value to determine whether or not the Logic circuit 14 has failed.

In Clock-off process, the operation of stopping the supplying of the test clock signal TCK to the Logic circuit 14 is performed. Specifically, the Diagnostic control circuit 12 gradually stops supplying the test clock signal TCK to the Logic circuit 14 by gradually decreasing the frequency of the test clock signal TCK generated by the Test clock generation circuit 132 while the test pattern is not generated by the test circuit 131. As a result, the power consumption is further gradually reduced in a state in which the rate of change of the current consumption is suppressed within the allowable range.

Thereafter, the test sequencer 122 outputs a normal completion signal NE1 indicating that the Self-diagnostic circuit 13 has diagnosed the Logic circuit 14 to the system control circuit 11. When the system control circuit 11 receives a normal termination signal NE1, it outputs a reset signal RST to the Logic circuit 14. The Logic circuit 14 is thereby initialized, step S107.

The Reset process of the Logic circuit 14 is not limited to the system control circuit 11, and may be incorporated in a part of the Diagnostic process by the test sequencer 122. In this instance, the test sequencer 122 outputs a normal termination signal NE1 indicating that the Self-diagnostic circuit 13 has finished diagnosing the Logic circuit 14 to the system control circuit 11 after the Reset process is completed. Thereby, the Logic circuit 14 is initialized, and the operation mode is switched from the self-diagnosis mode to the normal operation mode.

Figure 3:
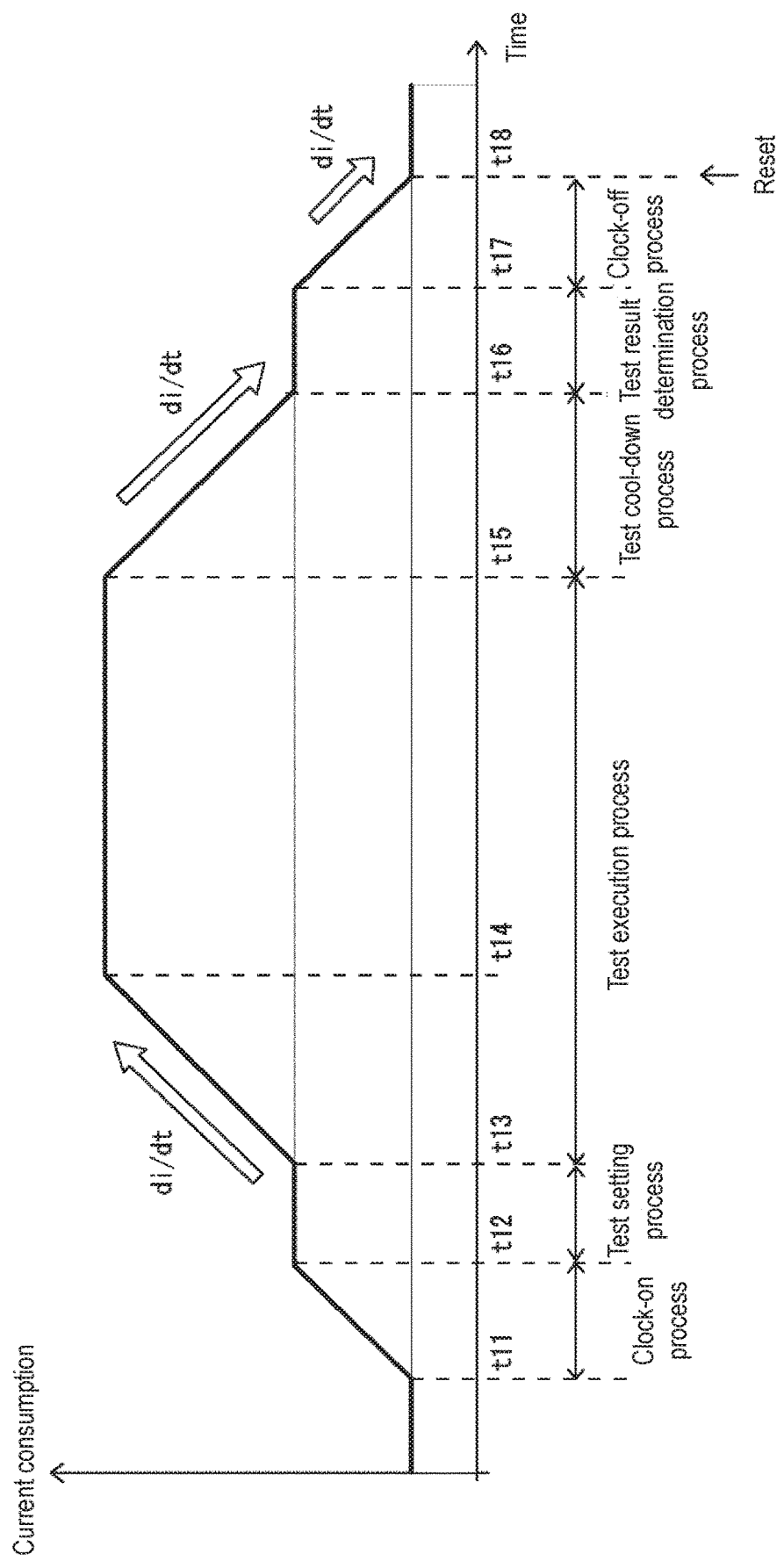
FIG. 3 is a timing chart illustrating a change in the current consumption of a semiconductor device shown in FIG. 1 in which a self-diagnosis was normally performed.

FIG. 3 is a timing chart showing a change in the consumption current of the semiconductor device 1 when the self-diagnosis is normally performed. Referring to FIG. 3, during the Clock-on process period, the current consumed by the test clock signal TCK increases due to the operation of the test clock signal TCK, i.e., from time t11 to time t12. Thereafter, during the Test execution process period, the current consumption is further increased by the testing operation of the Logic circuit 14 (times t13 to t14), and thereafter, the current consumption is maintained at a higher value (times t14 to t15). The reason why the current consumed during the Test execution process is increased is that the activation rates of the test circuit 131 and the Logic circuit 14 are increased when the test pattern and the test result are transferred between the Self-diagnostic circuit 13 and the Logic circuit 14. Since the frequency of the test clock signal TCK gradually decreases to a predetermined frequency during the Test cool-down process after Test execution process, the consumed current decreases while the rate of change of the test clock signal TCK is kept within an allowable range (time t15 to t16). Thereafter, even during the Clock-off process period, the frequency of the test clock signal TCK further gradually decreases, so that the consumed current further decreases while the rate of change of the test clock signal TCK is kept within the allowable range (time t17 to t18).

Next, the operation of stopping the Diagnostic process of the semiconductor device 1 will be described with reference to FIG. 2.

Here, prior to describing the operation of stopping the Diagnostic process of the semiconductor device 1, the operation of stopping the Diagnostic process of the semiconductor device 50, which is a comparative embodiment, will be described.

Figure 12:
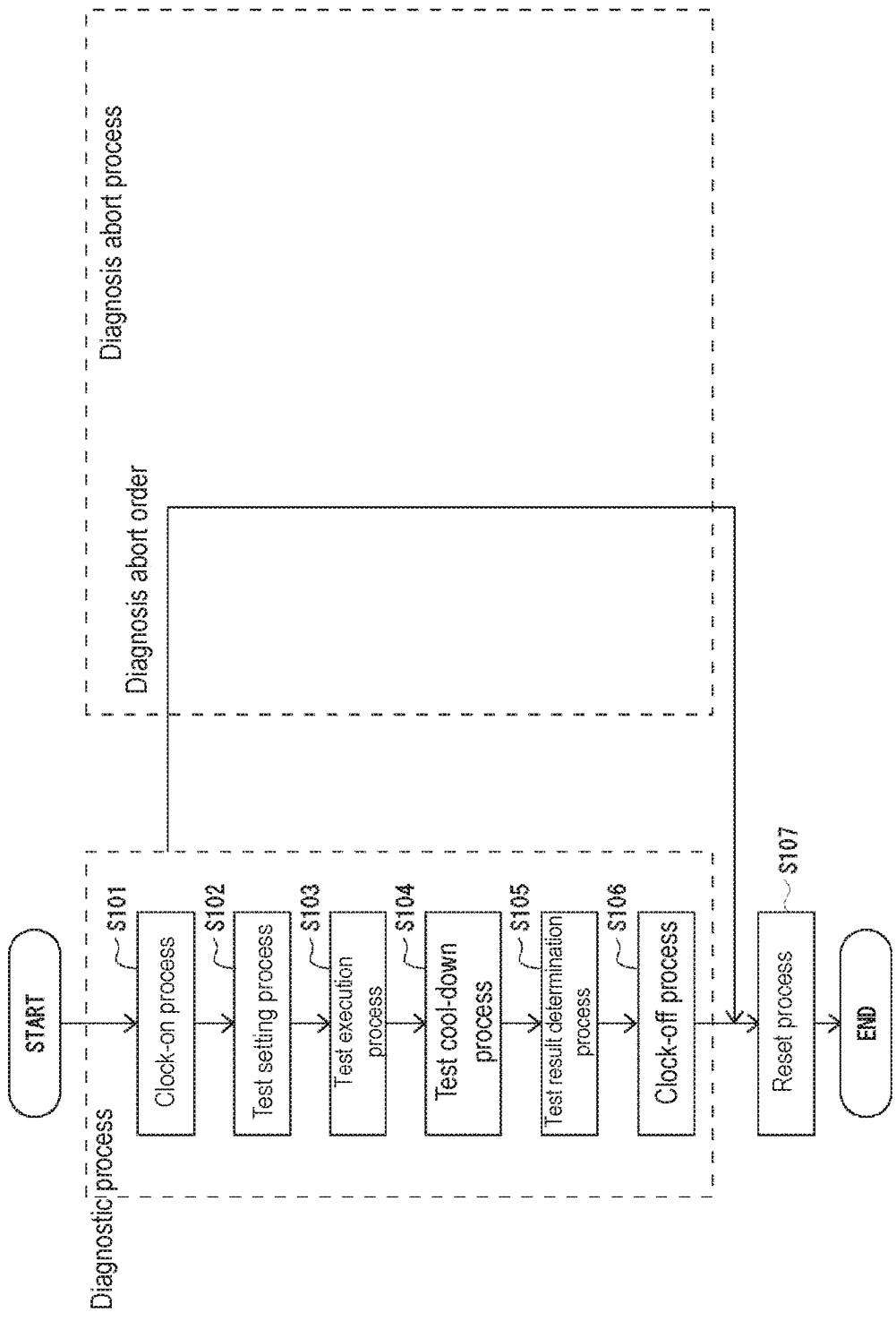
FIG. 12 is a flow chart illustrating the operation of a self-diagnosis of a semiconductor device according to a comparative example.

FIG. 12 is a flowchart showing the operation of self-diagnosis of the semiconductor device 50 according to the comparative example. As shown in FIG. 12, the operation of the self-diagnosis in the normal state of the semiconductor device 50 is the same as that in the case of the semiconductor device 1, and therefore the description thereof is omitted.

Semiconductor device 50 immediately stops operation of the Self-diagnostic circuit when it receives a signal (e.g., a reset signal from an upper system external to semiconductor device 50) indicating the cessation of the Diagnostic process at any time during the execution of the Diagnostic process. Accordingly, in the semiconductor device 50, there was a problem that the current consumed would change abruptly when the Diagnostic process being executed is stopped.

Figure 13:
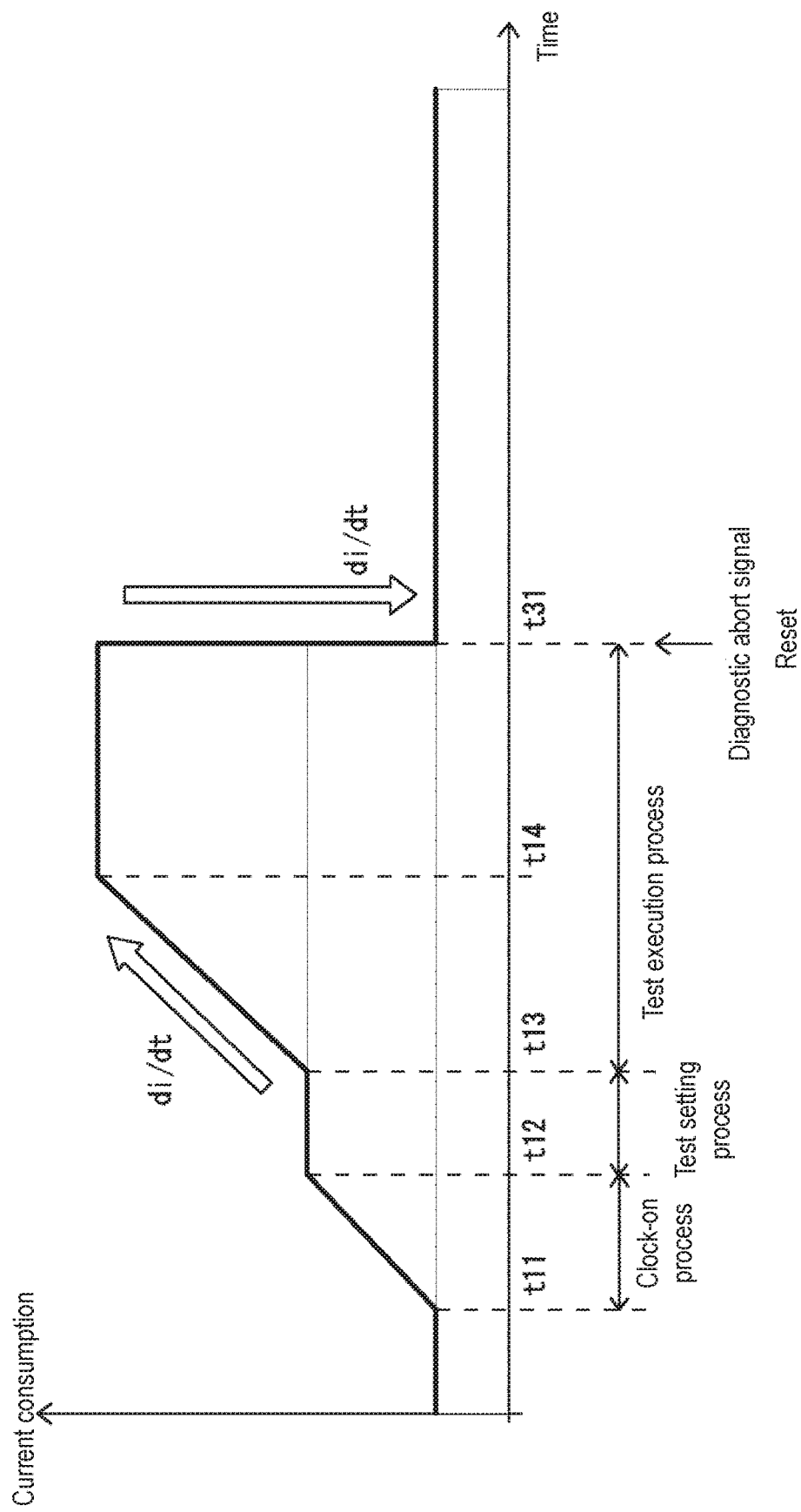
FIG. 13 is a timing chart illustrating a change in the current consumption of a semiconductor device according to a comparative example.

FIG. 13 is a timing chart showing a change in current consumption of the semiconductor device 50 according to the comparative example. In FIG. 13, the semiconductor device 50 receives a signal instructing Diagnosis abort during the Test execution process (step S103 in FIG. 12) (time t31).

Referring to FIG. 13, the semiconductor device 50 immediately stops operation of the Self-diagnostic circuit when it receives a signal indicating Diagnosis abort during the Test execution process. Accordingly, in the semiconductor device 50, the current consumed changes sharply when the running Diagnostic process is stopped. In other words, the rate of change (di/dt) of the consumed current becomes larger than the allowable range. As a result, for example, the fluctuation of the power supply voltage becomes large, so that the operation of the semiconductor device 50 becomes unstable.

On the other hand, when the semiconductor device 1 receives a signal instructing the stop of the Diagnostic process (for example, a reset signal RST from a host system provided outside the semiconductor device 1) at any time during the Diagnostic process, the operation of the Self-diagnostic circuit 13 is stopped stepwise (gradually) rather than immediately stopping the operation of the Self-diagnostic circuit 13. Accordingly, the semiconductor device 1 can suppress the abrupt change in the current consumed even when the Diagnostic process is interrupted during execution.

Specifically, when the system control circuit 11 receives an external reset signal RST, the system control circuit 11 suspends the output of the reset signal RST for the Logic circuit 14 and outputs the Diagnosis abort signal BR1 indicating the Diagnosis abort of the Logic circuit 14 to the Diagnostic control circuit 12.

Upon receiving the Diagnosis abort signal BR1 from the system control circuit 11, the Diagnostic abort control circuit 123 determines the content of the currently executed process from the address information AD1 included in the access signal from the test sequencer 122 to the memory 121. Thereafter, the Diagnostic abort control circuit 123 stops the diagnosing of the Logic circuit 14 by the Self-diagnostic circuit 13 in stages by using the Diagnosis abort processing content corresponding to the processing content currently being executed.

For example, when the Self-diagnostic circuit 13 is executing Clock-on process (YES in step S201), the Diagnostic abort control circuit 123 causes the Self-diagnostic circuit 13 to execute Clock-off process (step S206) after completion of execution of Clock-on process (step S204). When the Self-diagnostic circuit 13 is executing Clock-on process (YES in the S201 of steps), the Diagnostic abort control circuit 123 may cause the Self-diagnostic circuit 13 to execute Clock-off process without waiting for the completion of execution of Clock-on process.

When the Self-diagnostic circuit 13 is executing Test execution process (NO in step S201→YES in step S202), or when the Test cool-down process is executing (NO in step S201→NO in step S202 YES in step S203), the Diagnostic abort control circuit 123 causes the Self-diagnostic circuit 13 to execute Clock-off process (step S206) after completion of execution of Test cool-down process (step S205).

Further, when the Self-diagnostic circuit 13 is executing another processing (for example, any of the processing of Test setting process, the Test result determination process, and the Clock-off process) (NO in step S201→NO in step S202→NO in step S203), the Diagnostic abort control circuit 123 causes the Self-diagnostic circuit 13 to execute Clock-off process (step S206).

When the Diagnostic abort control circuit 123 receives the Diagnosis abort completion signal FN0 from the test sequencer 122 after the Self-diagnostic circuit 13 completes executing the Clock-off process (step S206), it outputs the Diagnosis abort completion signal FN1 to the system control circuit 11.

When receiving the Diagnosis abort completion signal FN1, the system control circuit 11 outputs the pending reset signal RST to the Logic circuit 14. The Logic circuit 14 is thereby initialized, step S107. Thereafter, the operation mode is switched from the self-diagnosis mode to the normal operation mode.

Figure 4:
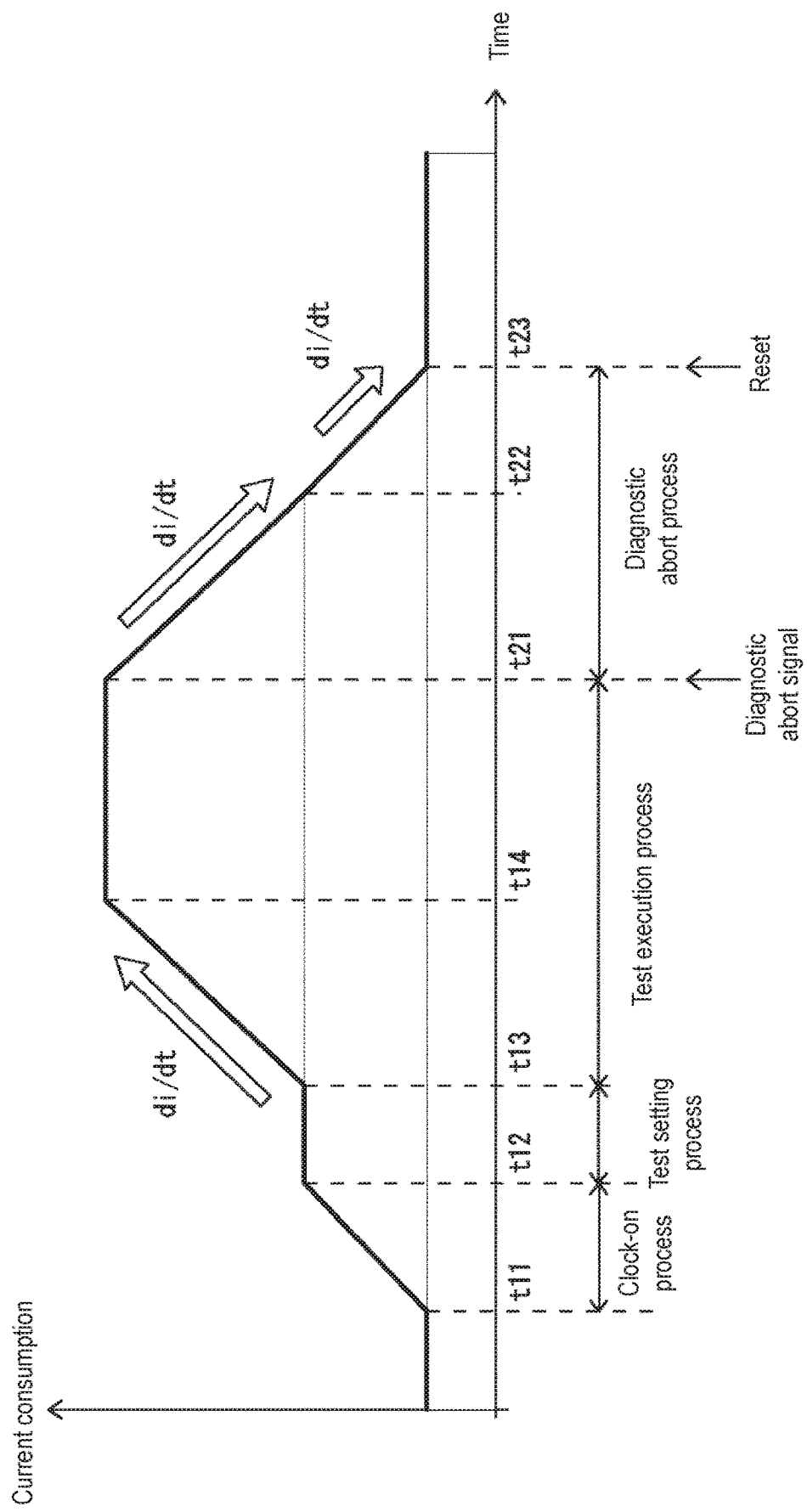
FIG. 4 is a timing chart showing the change in the current consumption of the semiconductor device shown in FIG. 1 when the diagnosis is discontinued.

FIG. 4 is a timing chart showing a change in current consumed by the semiconductor device 1 when the Diagnostic process being executed is stopped. In FIG. 4, the semiconductor device 1 receives a signal instructing Diagnosis abort during the Test execution process (step S103 in FIG. 2) (time t21).

Referring to FIG. 4, when the semiconductor device 1 receives a signal indicative of Diagnosis abort during a Test execution process, the semiconductor device 1 causes the Diagnostic abort control circuit 123 to execute a Test cool-down process (time t21 to t22) and to execute a Clock-off process (time t22 to t23) rather than immediately stopping the operation of the Self-diagnostic circuit 13. Thereafter, the semiconductor device 1 initializes the Logic circuit 14 by applying the reset signal RST, which is held by the system control circuit 11, to the Logic circuit 14 while the power consumed by the semiconductor device 1 is sufficiently reduced. Accordingly, the semiconductor device 1 can suppress the abrupt change in the current consumed even when the Diagnostic process is interrupted during execution. That is, the semiconductor device 1 can keep the rate of change (di/dt) of the current consumed within the allowable range even when the Diagnostic process is stopped during execution.

As described above, the semiconductor device 1 according to the present embodiment has a self-diagnostic function for performing a diagnosis of the Logic circuit 14, which is a circuit to be diagnosed, and when receiving an interruption signal indicating the interruption of the Diagnostic process during the execution of the Diagnostic process, the Diagnostic process is stopped in a step-by-step manner. Accordingly, the semiconductor device 1 according to the present embodiment can suppress a steep change in the current consumed even when the Diagnostic process is stopped during execution. As a result, the fluctuation of the power supply voltage is suppressed, so that the operation of the semiconductor device 1 is stabilized.

Next, some examples of the modification of the Test cool-down process and the frequency control of the test clock signal will be described with reference to FIG. 5, FIG. 6, and FIG. 7.

Figure 5:
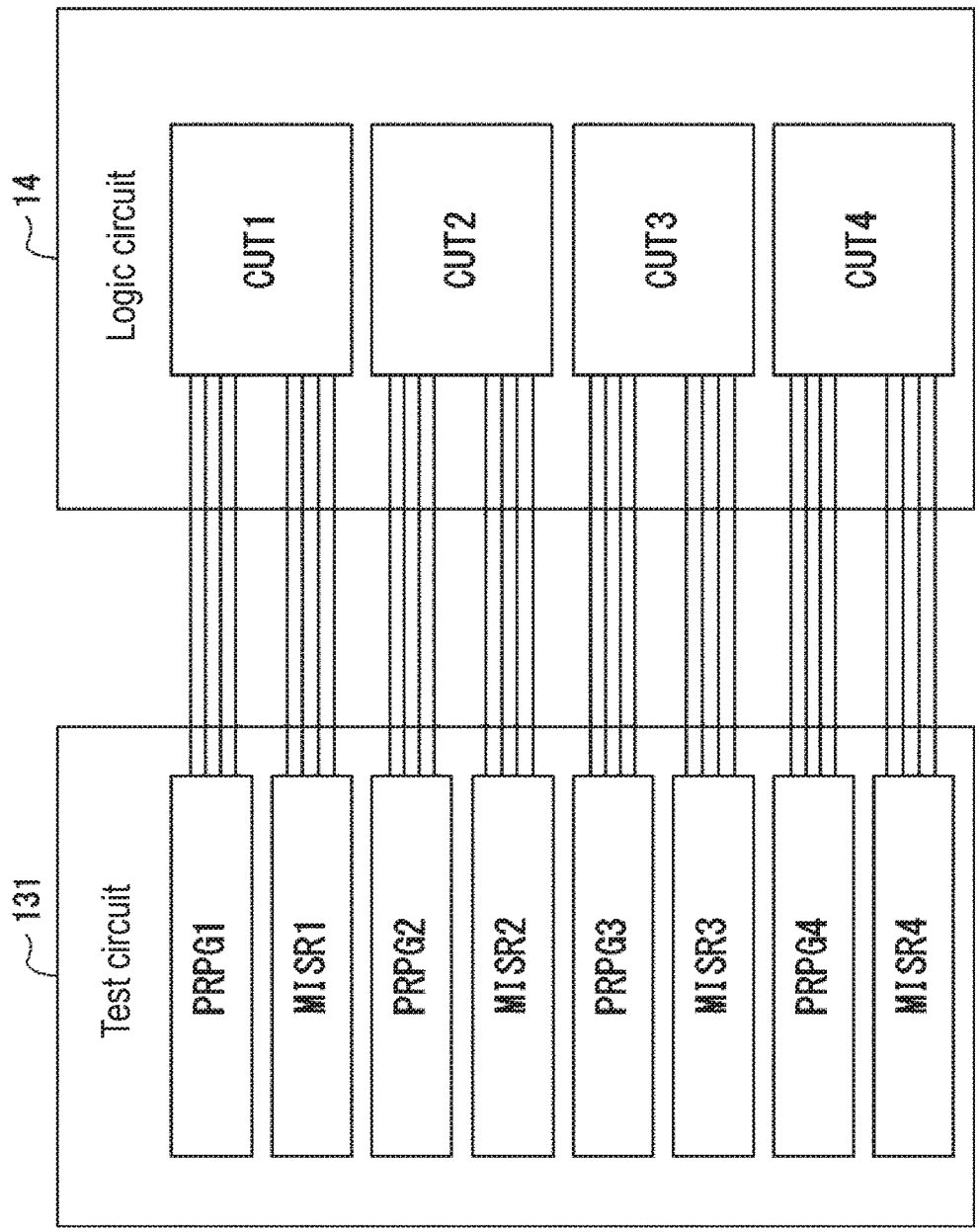
FIG. 5 is a diagram for explaining a modification of the Test cool-down process.

FIG. 5 is a diagram for explaining a variation of the Test cool-down process. In the example of FIG. 5, the power consumption is gradually reduced by the spatial slice control.

Referring to FIG. 5, for example, the test circuit 131 includes four test pattern generating circuits PRPG1~PRPG4 and four corresponding test result compressing circuits MISR1~MISR4. The Logic circuit 14 includes four Logic circuit CUT1 to CUT4.

The test pattern generation circuits PRPG1~PRPG4 generate test patterns and output the test patterns to the Logic circuit CUT1 to CUT4, respectively. The test result compressing circuits MISR1~MISR4 compress the test results of the Logic circuit CUT1 to CUT4, respectively.

Here, the Diagnostic abort control circuit 123 stops the generation of the test pattern by the test pattern generation circuit PRPG1, then stops the generation of the test pattern by the test pattern generation circuit PRPG2, then stops the generation of the test pattern by the test pattern generation circuit PRPG3, and then stops the generation of the test pattern by the test pattern generation circuit PRPG4. As a result, the rate of change of the consumed current becomes smaller than when the generation of the test pattern by the test pattern generation circuits PRPG1~PRPG4 is simultaneously stopped.

In this example, the case where four test pattern generation circuits are provided has been described, but the present invention is not limited to this, and any number of test pattern generation circuits may be provided. In the present embodiment, the operation of the plurality of test pattern generation circuits is stopped one by one in order, but the present invention is not limited to this. The operation of the plurality of test pattern generation circuits may be stopped two or more times in order.

In the Test cool-down process, the spatial slice control described above and the step-wise reduction of the frequency of the test clock signal TCK may be combined and used.

Figure 6:
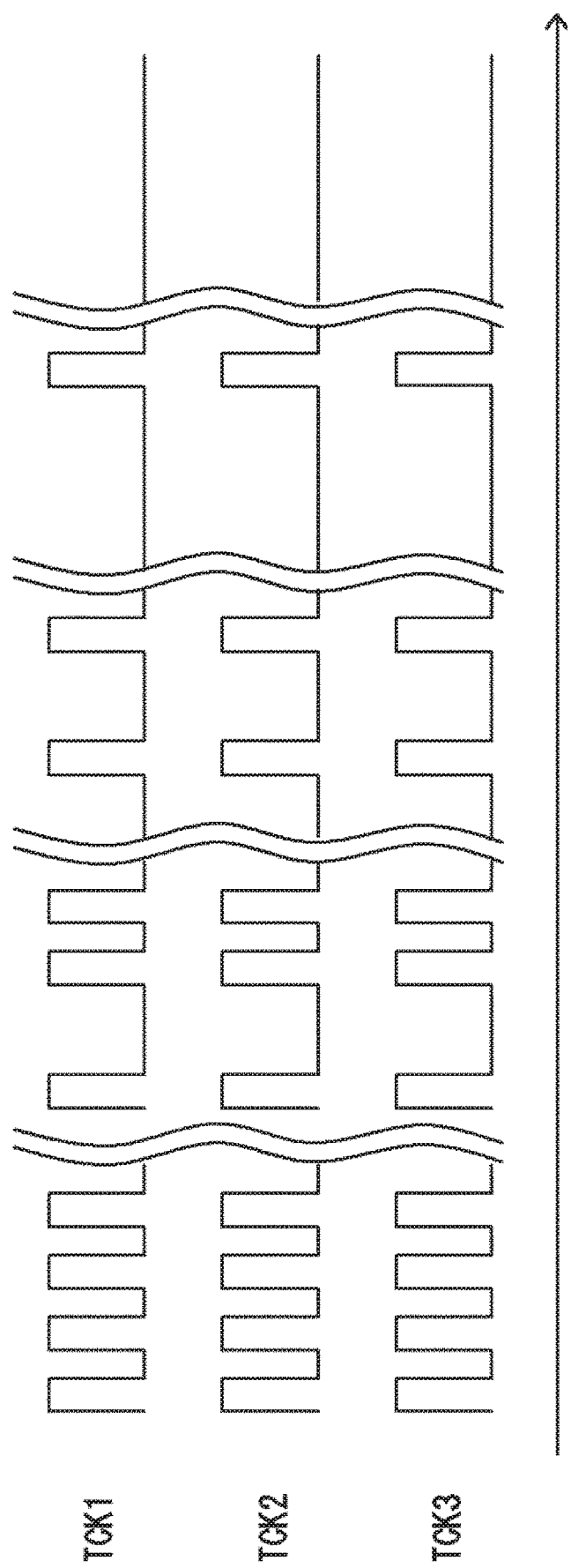
FIG. 6 is a diagram for explaining an example of frequency control of a test clock signal.

FIG. 6 is a diagram for explaining an example of the frequency control of the test clock signal. Referring to FIG. 6, when the test clock signal TCK1~TCK3 is supplied to the Logic circuit 14, which is a circuit to be diagnosed, the Diagnostic abort control circuit 123 reduces the frequency of each of the test clock signals TCK1~TCK3 in a stepwise manner by thinning out the respective pulse waveforms of the test clock signal TCK1~TCK3 in parallel in a stepwise manner. As a result, the rate of change of the current consumption is suppressed within an allowable range.

Figure 7:
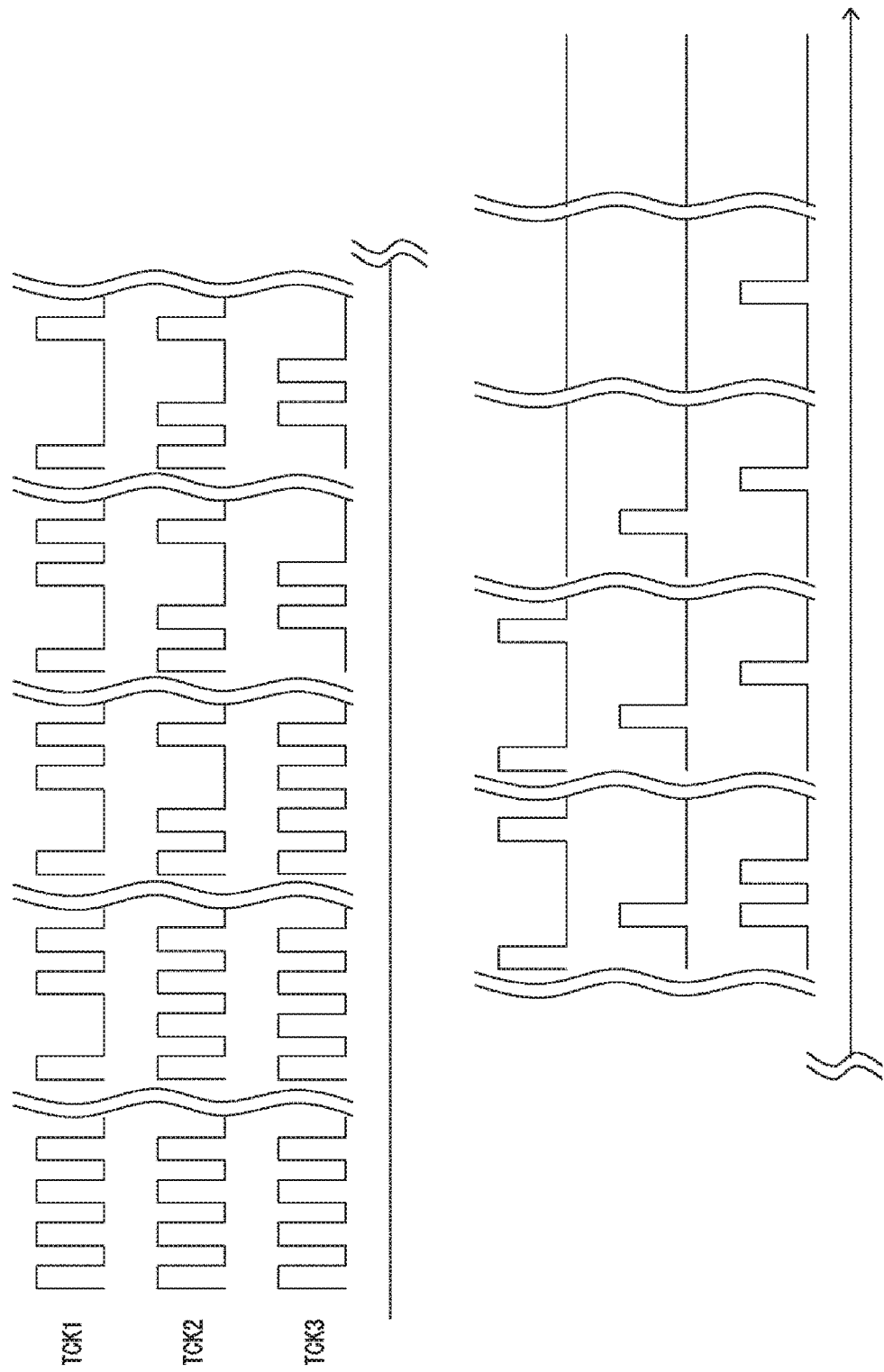
FIG. 7 is a diagram for explaining another example of frequency control of a test clock signal.

FIG. 7 is a diagram for explaining another example of the frequency control of the test clock signal. Referring to FIG. 7, when the test clock signal TCK1~TCK3 is supplied to the Logic circuit 14, which is a circuit to be diagnosed, the Diagnostic abort control circuit 123 decreases the frequency of each of the test clock signals TCK1~TCK3 in a stepwise manner by individually thinning out the pulse waveforms of the test clock signal TCK1~TCK3 in a stepwise manner. As a result, the rate of change of the current consumption is suppressed within an allowable range.

Next, an example of a program stored in the memory 121 will be described with reference to FIG. 8.

FIG. 8 is a diagram showing an example of a program stored in the memory 121 of the semiconductor device 1. FIG. 14 is a diagram showing an example of a program stored in the memory of the semiconductor device 50 as a comparative example.

First, referring to FIG. 14, programs relating to Clock-on process, Test setting process, Test execution process, Test cool-down process, Test result determination process, and Clock-off process are stored in the memory of the semiconductor device 50, which is a comparative example, in each storage area of the address numbers 001 to 006.

First, the test sequencer accesses the storage area of the address number 001 to acquire the program related to the Clock-on process. Then, based on the acquired programs, the test sequencer acquires relevant data from the memories as required, and then causes the Self-diagnostic circuit to execute the Clock-on process. After the Clock-on process, the test sequencer accesses the storage area of the address number 002 to acquire the program related to the Test setting process. Then, based on the acquired programs, the test sequencer acquires relevant data from the memories as required, and then causes the Self-diagnostic circuit to execute the Test setting process. In the same manner, the test sequencer 122 sequentially acquires the programs relating to Test execution process, the Test cool-down process, the Test result determination process, and the Clock-off process from the respective storage areas of the addresses 003 to 006, and causes the Self-diagnostic circuit to execute the respective processes based on the acquired programs.

Next, referring to FIG. 8, in the memory 121 of the semiconductor device 1 according to the present embodiment, programs relating to Clock-on process, the Test setting process, the Test execution process, the Test cool-down process, the Test result determination process, jumping instructions to the address number 021, and Clock-off process are stored in respective storage areas of the address numbers 001 to 006, 021. Programs relating to the first abort processing, the Test cool-down process, the jump instruction to the address number 021, and the second abort processing are stored in respective storage areas of the address numbers 010 to 012 and 020.

For example, when the Diagnostic process of the semiconductor device 1 is normally performed, the test sequencer 122 acquires, in order from the respective storage areas of the address numbers 001 to 006 and 021, the programs relating to the Clock-on process, the Test setting process, the Test execution process, the Test cool-down process, the Test result determination process, the jumping instruction to the address number 021, and the Clock-off process, and causes the Self-diagnostic circuit 13 to execute the respective processes based on the acquired programs. The jump instruction to the address number 021 means that the address number of the storage area to be accessed is jumped to the address number 021. Therefore, in this embodiment, after Test result determination process, the process shifts to Clock-off process.

On the other hand, when the Diagnostic process of the semiconductor device 1 is stopped, the Diagnostic abort control circuit 123 first determines the content of the currently executed process from the address information AD1 included in the access signal from the test sequencer 122 to the memory 121.

For example, when the Diagnostic abort control circuit 123 receives the Diagnosis abort signal BR1 while the test sequencer 122 accesses any one of the storage areas of the memory 121 with the address number 003 and the address number 004, the test sequencer 123 determines that the currently executed process content is either Test execution process or Test cool-down process.

If the Diagnostic abort control circuit 123 determines that the currently executed process is either Test execution process or Test cool-down process, it outputs a jump signal JP1 to the test sequencer 122 to switch the access to the storage area of the address number 010. As a result, the test sequencer 122 switches the access to the storage area of the address number 010. Thereafter, the test sequencer 122 sequentially acquires programs relating to the Test cool-down process, the jumping instruction to the address number 021, and the Clock-off process from the respective storage areas of the address numbers 011, 012, and 021, and causes the Self-diagnostic circuit 13 to execute the respective processes based on the acquired programs.

That is, when the currently executed process content is either Test execution process or Test cool-down process, the Diagnostic abort control circuit 123 causes the Self-diagnostic circuit 13 to execute Test cool-down process and Clock-off process in order, thereby stopping the Diagnostic process by the Self-diagnostic circuit 13 in stages.

For example, when the Diagnostic abort control circuit 123 receives the Diagnosis abort signal BR1 while the test sequencer 122 accesses any one of the storage areas of the memory 121 having the address numbers 001, 002, and 005, the test sequencer 123 determines that the currently executed process content is any one of the Clock-on process, the Test setting process, and the Test result determination process.

Here, when the Diagnostic abort control circuit 123 determines that the currently executed process content is any one of the Clock-on process, the Test setting process, and the Test result determination process, it outputs a jump signal JP1 to the test sequencer 122 so as to switch the access to the storage area of the address number 020. As a result, the test sequencer 122 switches the access to the storage area of the address number 020. Thereafter, the test sequencer 122 acquires a program related to Clock-off process from the storage area of the address number 021, and causes the Self-diagnostic circuit 13 to execute Clock-off process based on the acquired program.

That is, the Diagnostic abort control circuit 123 causes the Self-diagnostic circuit 13 to execute the Clock-off process, thereby stopping the Diagnostic process by the Self-diagnostic circuit 13 in stages, when the currently executed process content is any one of the Clock-on process, the Test setting process, and the Test result determination process. When it is determined that the currently executed process content is Clock-on process, the Diagnostic process may shift to Clock-off process after the execution of the Clock-on process is completed, or may shift to Clock-off process prior to the execution of the Clock-on process is completed.

Figure 9:
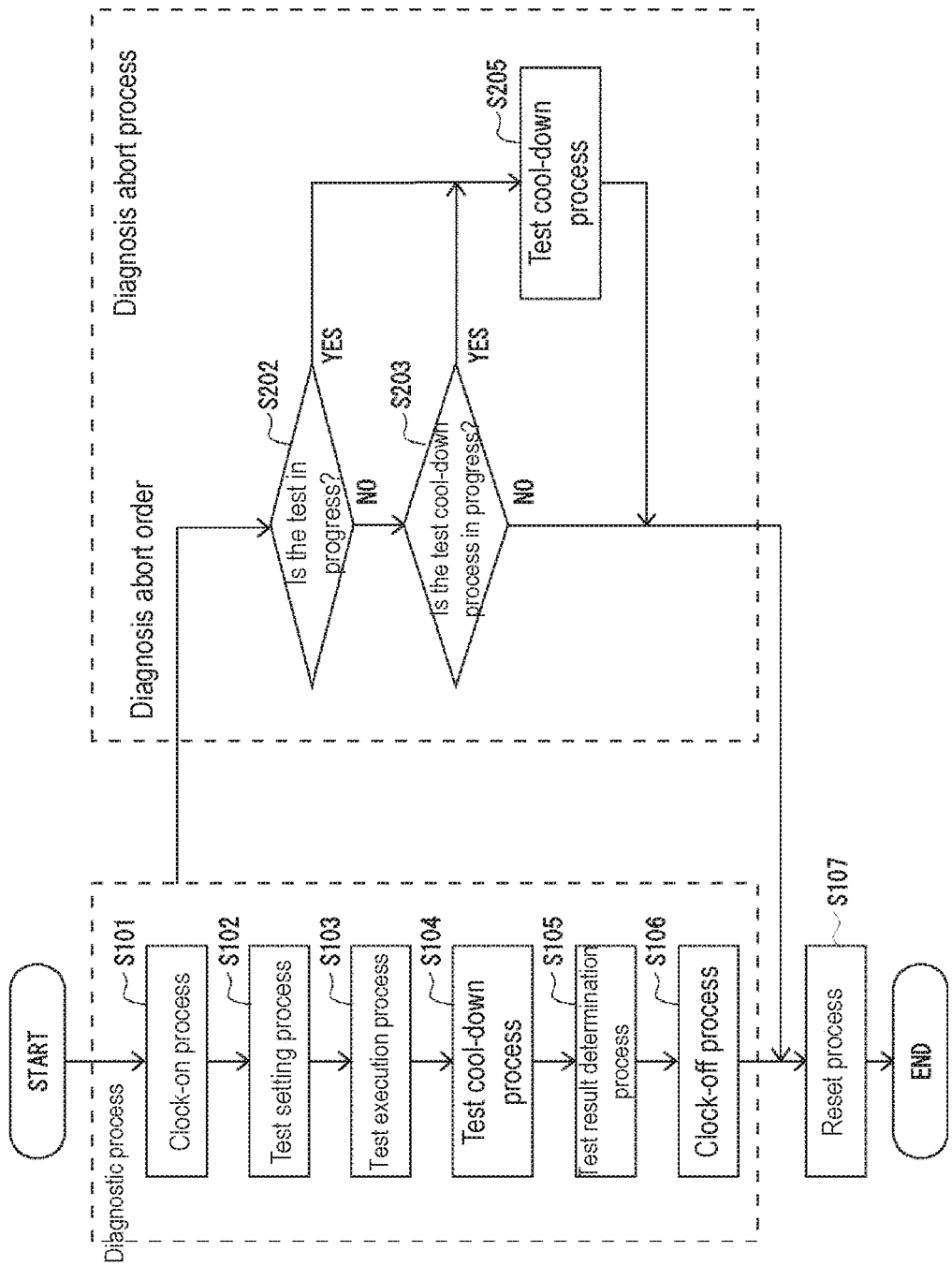
FIG. 9 is a flow chart illustrating the operation of a self-diagnosis of a semiconductor device according to the second embodiment.

FIG. 9 is a flowchart showing an operation at the time of self-diagnosis of the semiconductor device 2 according to the second embodiment. Since the configuration of the semiconductor device 2 is the same as that of the semiconductor device 1, the description thereof is omitted.

The operation of the self-diagnosis in the normal state of the semiconductor device 2 is the same as that in the case of the semiconductor device 1, and therefore the description thereof is omitted. Therefore, the Diagnosis abort operation of the semiconductor device 2 will be described below.

When the system control circuit 11 receives a signal indicative of Diagnostic process interruption (e.g., a reset signal RST from an upper system external to the semiconductor device 2), the system control circuit 11 suspends the output of the reset signal RST for the Logic circuit 14 and outputs an Diagnosis abort signal BR1 indicating the Diagnosis abort of the Logic circuit 14 to the Diagnostic control circuit 12.

Upon receiving the Diagnosis abort signal BR1 from the system control circuit 11, the Diagnostic abort control circuit 123 determines the content of the currently executed process from the address information AD1 included in the access signal from the test sequencer 122 to the memory 121. Thereafter, the Diagnostic abort control circuit 123 stops the diagnosing of the Logic circuit 14 by the Self-diagnostic circuit 13 in stages by using the Diagnosis abort processing content corresponding to the processing content currently being executed.

For example, the Diagnostic abort control circuit 123 causes the Self-diagnostic circuit 13 to execute Test cool-down process (Step S205) when the Self-diagnostic circuit 13 is executing Test execution process (Step S202: YES) or when the Test cool-down process is executing (Step S202: NO Step S203: YES). When the Diagnostic abort control circuit 123 receives the Diagnosis abort completion signal FN0 from the test sequencer 122 after the Self-diagnostic circuit 13 completes the execution of the Test cool-down process, it outputs the Diagnosis abort completion signal FN1 to the system control circuit 11 without causing the Self-diagnostic circuit 13 to execute the Clock-off process.

When the Self-diagnostic circuit 13 is executing another processing (for example, any of the processing of Clock-on process, the Test setting process, the Test result determination process, and the Clock-off process) (NO in step S202→NO in step S203), the Diagnostic abort control circuit 123, upon receiving the Diagnosis abort completion signal FN0 from the test sequencer 122, outputs the Diagnosis abort completion signal FN1 to the system control circuit 11 without causing the Self-diagnostic circuit 13 to execute Clock-off process.

When receiving the Diagnosis abort completion signal FN1, the system control circuit 11 outputs the pending reset signal RST to the Logic circuit 14. The Logic circuit 14 is thereby initialized, step S107.

In this manner, the semiconductor device 2 causes the Diagnostic abort control circuit 123 to perform Test cool-down process as needed upon receipt of a signal indicative of Diagnostic process interruption. Thereafter, the semiconductor device 2 initializes the Logic circuit 14 by applying the reset signal RST held by the system control circuit 11 to the Logic circuit 14 with the power consumed sufficiently low. As a result, the semiconductor device 2 can suppress a sharp change in the consumed current even when the Diagnostic process being executed is stopped, as in the case of the semiconductor device 1. That is, the semiconductor device 2 can keep the rate of change (di/dt) of the current consumed within the allowable range even if the Diagnostic process is stopped during execution.

Further, the semiconductor device 2 initializes the Logic circuit 14, which is the circuit to be diagnosed, without having the Diagnostic abort control circuit 123 execute the Test cool-down process as needed, and then execute the Clock-off process when it receives a signal indicating that the Diagnostic process is stopped. As a result, even when the operation mode is shifted from the self-diagnosis mode to the normal operation mode (user mode) in a case where the clock frequency in the normal operation is equal to or higher than the clock frequency in the self-diagnosis, for example, the semiconductor device 2 can suppress a sharp change in the consumed current due to the re-operation of the clock signals supplied to the Logic circuit 14.

Figure 10:
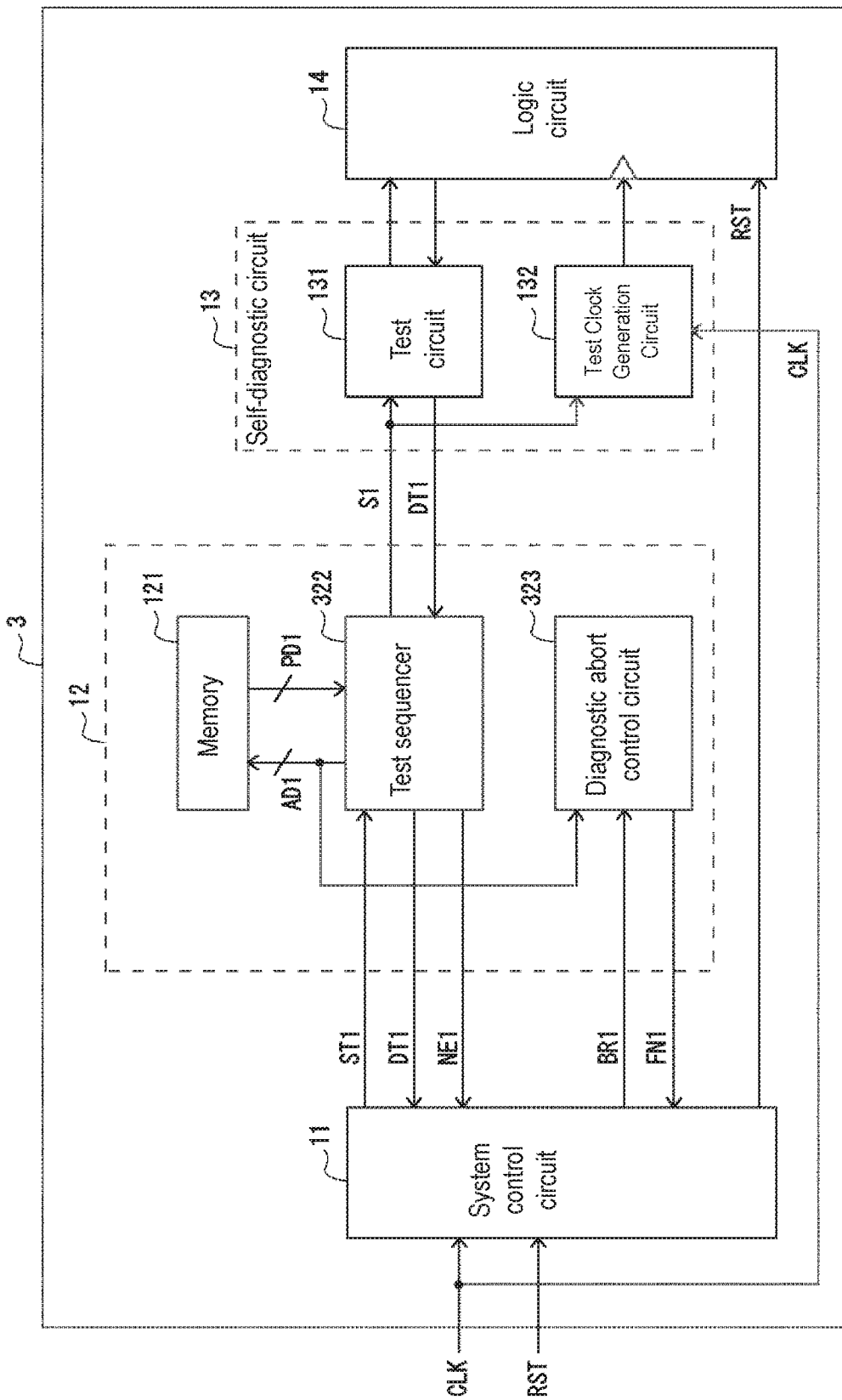
FIG. 10 is a block diagram illustrating an example of a configuration of a semiconductor device according to the third embodiment.

FIG. 10 is a block diagram illustrating a configuration example of a semiconductor device 3 according to the third embodiment. Compared with the semiconductor device 1, the semiconductor device 3 includes the test sequencer 322 instead of the test sequencer 122, and includes the Diagnostic abort control circuit 323 instead of the Diagnostic abort control circuit 123.

Figure 11:
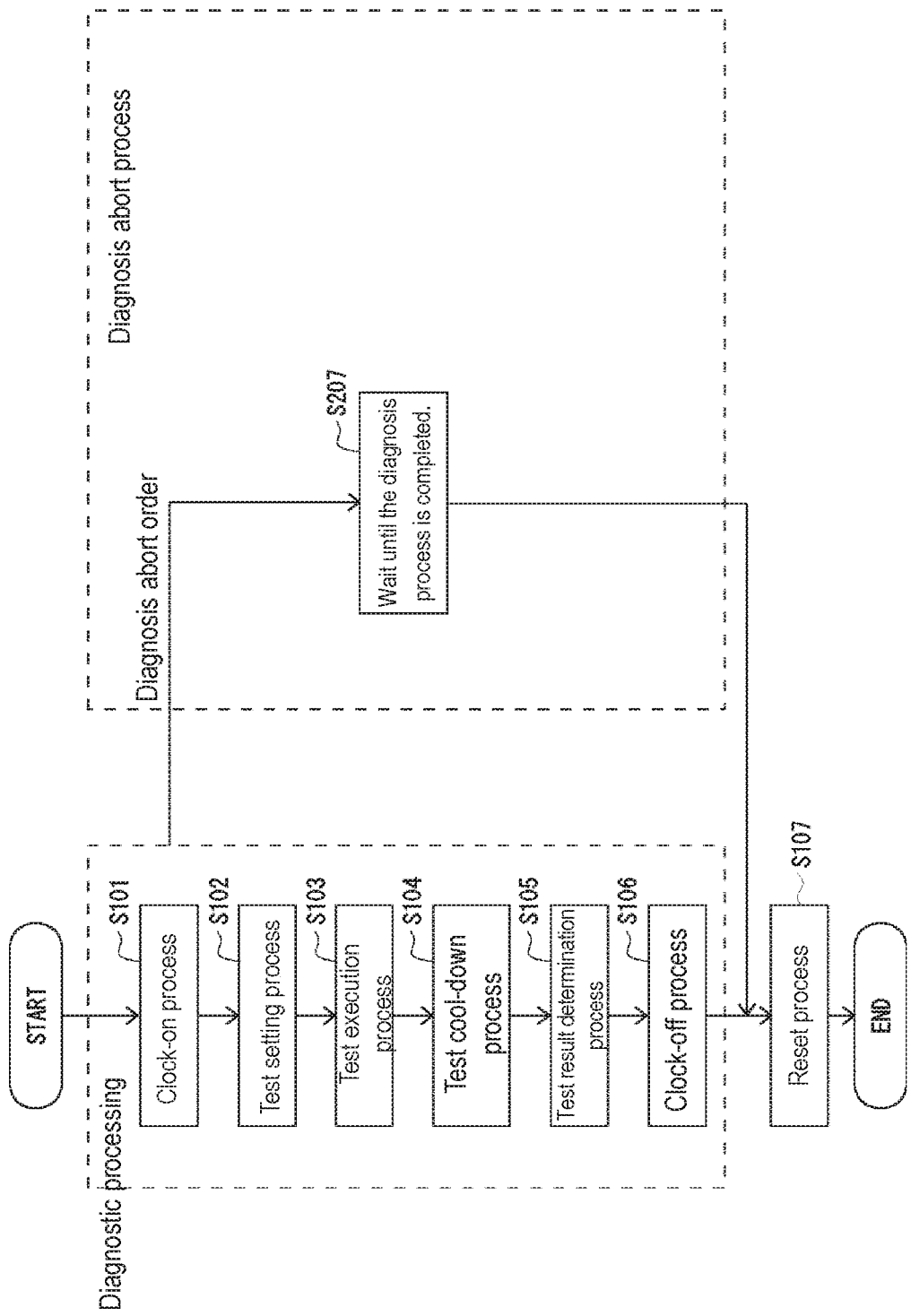
FIG. 11 is a flow chart illustrating the operation of a self-diagnosis of a semiconductor device.

The Diagnostic abort control circuit 323 does not output the jump signal JP1 to the test sequencer 122. The test sequencer 122 does not output the Diagnosis abort completion signal FN0 to the Diagnostic abort control circuit 323. Since the other configuration of the semiconductor device 3 is the same as that of the semiconductor device 1, the description thereof is omitted. FIG. 11 is a flowchart showing the operation of the semiconductor device 3 shown in FIG. 10 at the time of self-diagnosis. Since the operation of the self-diagnosis in the normal state of the semiconductor device 3 is the same as that in the case of the semiconductor device 1, the description thereof is omitted. Therefore, the Diagnosis abort operation of the semi-conductor device 3 will be described below.

When the system control circuit 11 receives a signal indicative of Diagnostic process interruption (e.g., a reset signal RST from a host system external to the semiconductor device 3), the system control circuit 11 suspends the output of the reset signal RST for the Logic circuit 14 and outputs an Diagnosis abort signal BR1 indicating the Diagnosis abort of the Logic circuit 14 to the Diagnostic control circuit 12.

Upon receipt of the Diagnosis abort signal BR1, the Diagnostic abort control circuit 323 waits S207 until the Diagnostic process of the Logic circuit 14 by the Self-diagnostic circuit 13 is completed. When the Diagnostic abort control circuit 323 determines that the Diagnostic process of the Logic circuit 14 by the Self-diagnostic circuit 13 is completed from the address-information AD1 included in the access signal from the test sequencer 122 to the memory 121, the address-information Diagnostic process outputs a Diagnosis abort completion signal FN1 to the system-control-circuit 11.

When receiving the Diagnosis abort completion signal FN1, the system control circuit 11 outputs the pending reset signal RST to the Logic circuit 14. The Logic circuit 14 is thereby initialized, step S107.

Thus, when the semiconductor device 3 receives a signal indicating that the Diagnostic process is stopped, the Diagnostic abort control circuit 323 waits until the Diagnostic process of the Logic circuit 14 by the Self-diagnostic circuit 13 is complete. After the Diagnostic process of the Logic circuit 14 by the Self-diagnostic circuit 13 is completed, the semiconductor device 3 initializes the Logic circuit 14 by applying the reset signal RST, which is held by the system control circuit 11, to the Logic circuit 14 with the consumed power sufficiently lowered. As a result, the semiconductor device 3 can suppress a sharp change in the consumed current even when the Diagnostic process being executed is stopped, as in the case of the semiconductor device 1. That is, the semiconductor device 3 can keep the rate of change (di/dt) of the current consumed within the allowable range even if the Diagnostic process is stopped during execution.

In this embodiment, it has been described, but is not limited to, the case where the system control circuit 11 outputs the pending reset signal RST to the Logic circuit 14 when it receives the Diagnosis abort completion signal FN1 from the Diagnostic abort control circuit 323. System control circuit 11 may be suitably modified to output the pending reset signal RST to Logic circuit 14 upon receipt of a normal termination signal NE1 from test sequencer 322.

As described above, the semiconductor devices 1 to 3 according to the above-described embodiments 1 to 3 have a self-diagnostic function for performing a diagnosis of the Logic circuit 14 as the circuit to be diagnosed, and when a stop signal indicating the discontinuation of the Diagnostic process is received during the execution of the Diagnostic process, the Diagnostic process is stopped step-by-step. As a result, the semiconductor devices 1 to 3 according to the first to third embodiments can suppress a sharp change in current consumed even when the semiconductor device 1 to 3 stops the Diagnostic process being executed. As a result, the fluctuation of the power supply voltage is suppressed, so that the operation of the semiconductor devices 1 to 3 is stabilized.

Although the invention made by the inventor has been specifically described based on the embodiment, the present invention is not limited to the embodiment already described, and it is needless to say that various modifications can be made without departing from the gist thereof.

What is claimed is:

1. A semiconductor device comprising:
 a circuit to be diagnosed;
 a self-diagnostic circuit that diagnoses the circuit to be diagnosed; and
 a diagnostic control circuit that controls the diagnosis of the circuit to be diagnosed by the self-diagnostic circuit, wherein a test clock is supplied to the circuit under diagnosis,
 wherein the diagnostic control circuit includes:
  a diagnostic abort control circuit that, when an abort signal indicating the abort of the diagnosis of the circuit to be diagnosed by the self-diagnostic circuit is received, aborts the diagnosis of the circuit to be diagnosed by the self-diagnostic circuit before stopping supplying the test clock to the circuit under diagnosis such that the diagnosis of the circuit is aborted while the test clock continues to be supplied to the circuit.

2. The semiconductor device according to claim 1, wherein the diagnostic abort control circuit is configured to, when receiving the abort signal during a period in which a test operation of the circuit under diagnosis is being performed by supplying a test pattern, cause the self-diagnostic circuit to perform a cool-down process of the test operation of the circuit under diagnosis, and then gradually decrease a frequency of the test clock supplied to the circuit under diagnosis.

3. The semiconductor device according to claim 2, wherein the diagnostic abort control circuit is configured to gradually decrease the frequency of the test clock supplied to the circuit under diagnosis together with the test pattern to a predetermined frequency in the cool-down process.

4. The semiconductor device according to claim 2,
 wherein the self-diagnostic circuit includes a plurality of test pattern generation circuits each generating the test pattern, and
 wherein the diagnostic abort control circuit is configured to sequentially halt the generation of test patterns by the plurality of test pattern generation circuits in the cool-down process.

5. The semiconductor device according to claim 1, wherein the diagnostic abort control circuit is configured to gradually decrease a frequency of the test clock supplied to the circuit under diagnosis after completion of a cool-down process when the abort signal is received during a period in which the cool-down process of a test operation of the circuit under diagnosis is performed.

6. The semiconductor device according to claim 1, wherein the diagnostic abort control circuit is configured to gradually decrease a frequency of a test clock supplied to the circuit under diagnosis when the abort signal is received during a period in which the self-diagnostic circuit sets a start of supplying the test clock to the circuit under diagnosis.

7. The semiconductor device according to claim 6, wherein the diagnostic abort control circuit is configured to gradually decrease the frequency of the test clock supplied to the circuit under diagnosis after setting of starting the supply of the test clock is completed.

8. The semiconductor device according to claim 1, wherein the diagnostic abort control circuit is configured to gradually decrease a frequency of the test clock supplied to the circuit under diagnosis when the abort signal is received in any of a period from a completion of setting of a start of supply of the test clock to the circuit under diagnosis by the self-diagnostic circuit to a start of a test operation of the circuit under diagnosis by the self-diagnostic circuit, a period during which a determination of a result of a test operation of the circuit under diagnosis is performed, and a period during which stopping the supply of the test clock to the circuit under diagnosis is performed.

9. The semiconductor device according to claim 1, wherein when the diagnostic abort control circuit receives the abort signal either during a period in which a test operation of the circuit under diagnosis is being performed by being supplied with a test pattern, or during a period in which a cool-down process of a test operation of the circuit under diagnosis is being performed, after a completion of a cool-down process of the test operation of the circuit under diagnosis, a mode is switched from a self-diagnosis mode to a normal operation mode without further decreasing a frequency of the test clock supplied to the circuit under diagnosis after completion of the cool-down process.

10. The semiconductor device according to claim 1, wherein the diagnostic abort control circuit is configured to, upon receiving the abort signal, gradually halt the diagnosis of the circuit under diagnosis by the self-diagnostic circuit by waiting for the diagnosis of the circuit under diagnosis by the self-diagnostic circuit to be completed.

11. The semiconductor device according to claim 1, wherein the abort signal is a reset signal.

12. A method of controlling self-diagnosis of a semiconductor device, the method comprising:
 diagnosing a circuit to be diagnosed by a self-diagnostic circuit, wherein a test clock is supplied to the circuit under diagnosis; and
 when an abort signal indicating the abort of the diagnosis of the circuit to be diagnosed by the self-diagnostic circuit is received, aborting the diagnosis of the circuit to be diagnosed by the self-diagnostic circuit before stopping supplying the test clock to the circuit under diagnosis such that the diagnosis of the circuit is aborted while the test clock continues to be supplied to the circuit.

* * * * *